United States Patent [19]

Yoakum

[11] 4,411,021
[45] Oct. 18, 1983

[54] AUTOMATIC THRESHOLD SQUELCH
[75] Inventor: John H. Yoakum, Hurst, Tex.
[73] Assignee: Motorola, Inc., Schaumburg, Ill.
[21] Appl. No.: 287,335
[22] Filed: Jul. 27, 1981
[51] Int. Cl.³ .............................................. H04B 1/10
[52] U.S. Cl. .................................... 455/222; 455/225
[58] Field of Search ............... 455/212, 218, 219–225, 455/303, 312, 220; 375/114; 328/163

[56] References Cited
U.S. PATENT DOCUMENTS

| | | | |
|---|---|---|---|
| 3,437,937 | 4/1969 | Warfield | 455/221 |
| 3,633,112 | 1/1972 | Anderson | 455/221 |
| 3,934,206 | 1/1976 | Holcek | 455/220 |

*Primary Examiner*—Jin F. Ng
*Attorney, Agent, or Firm*—James A. Scheer; James W. Gillman; Donald B. Southard

[57] ABSTRACT

An automatic threshold squelch circuit, responsive to noise signals from the receiver demodulator, having automatic means for setting the squelch level. A noise detector is coupled to the demodulator and to a comparator and sample and hold circuit such that a predetermined portion of the detected noise signal level is stored in the sample and hold circuit when no signal is being received. The stored noise level is then compared to the detected noise signal from the noise detector and a mute signal is generated in response to the detected noise level exceeding the stored signal level.

13 Claims, 2 Drawing Figures

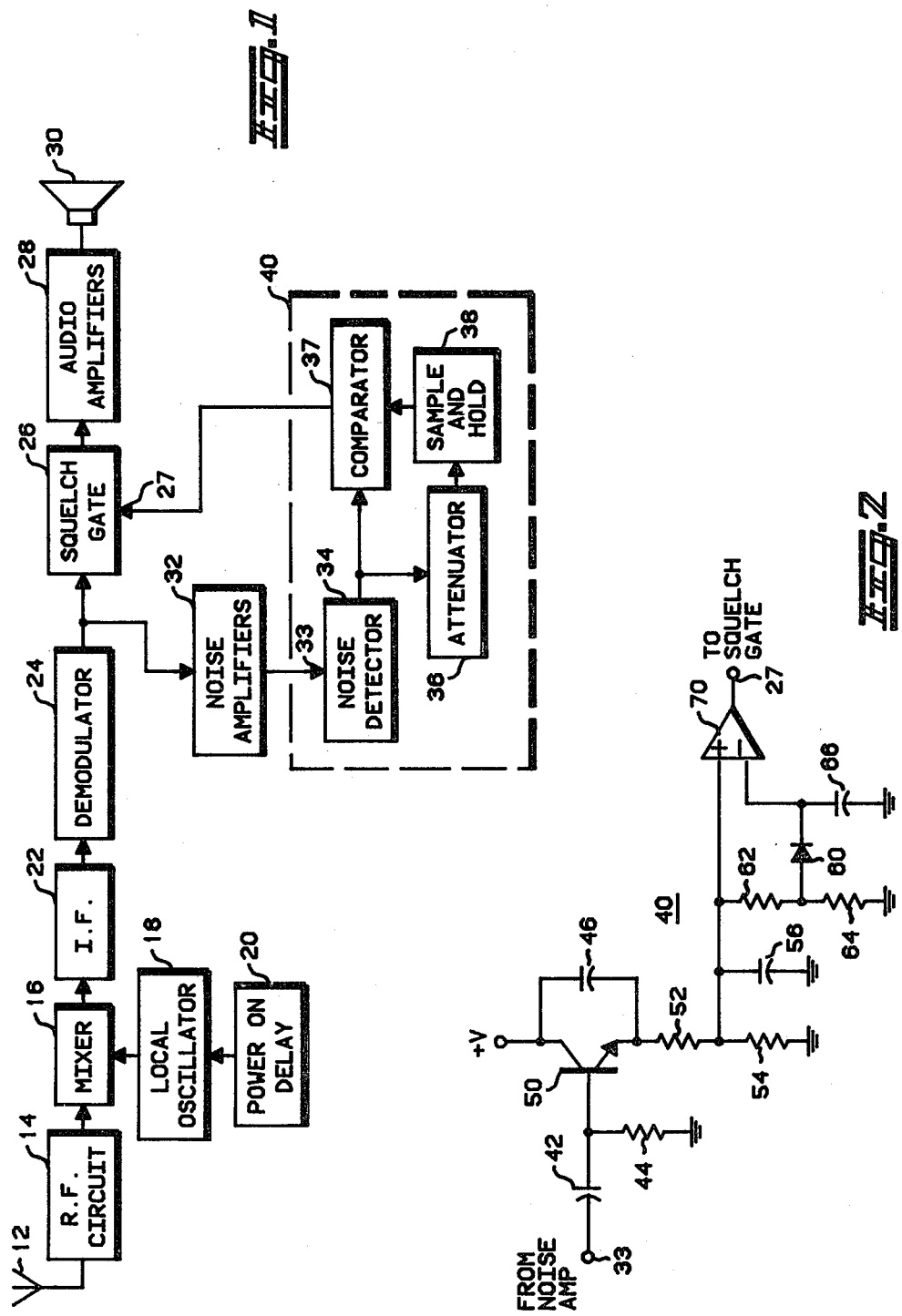

AUTOMATIC THRESHOLD SQUELCH

BACKGROUND OF THE INVENTION

1. Field of the Invention

The present invention relates generally to radio communications equipment, and more particularly to an improved radio receiver squelch circuit having automatic means for setting the squelch level.

2. Description of the Prior Art

The use of squelch detection techniques for turning the audio section of communications receivers on and off in order to eliminate noise output from the audio section during periods when no signal is received is well known in the communications art. A common technique detects the base band noise which originates in the IF limiter or descriminator. In such squelch circuits, a potentiometer is often employed for setting the desired point at which the squelch operation is to occur. The potentiometer is manually controlled by the radio operator and must be adjusted to the desired squelch setting. To eliminate this inconvenience, some radios are equipped with squelch circuits that have preset controls. These controls are preset at a rather tight squelch in order to prevent an unsquelched condition due to circuit aging, noise level differences in various areas, and gain variations due to temperature. However, because of the insensitivity of this squelch control, messages transmitted with a low signal strength may be missed because of squelch insensitivity. There thus remains a need in the field for a reliable and inexpensive squelch circuit which will automatically adjust the squelch level and compensate for ambient noise and temperature variations.

SUMMARY OF THE INVENTION

Accordingly, it is an object of this invention to provide a squelch circuit for a radio receiver which automatically adjusts the squelch level.

It is another object of this invention to provide a squelch circuit for a radio receiver which is simple and inexpensive to fabricate and compensates for temperature and ambient noise variations.

Briefly, according to the invention, an automatic threshold squelch circuit is provided, responsive to noise signals from the receiver demodulator and which generates a mute signal when no transmission is being received. The improved squelch circuit includes a noise detector for producing a unidirectional signal level as a function of the noise signals from the demodulator and a memory circuit, coupled to the noise detector, for sampling and storing the unidirectional signal level when no transmissions are being received. In addition, a comparator is coupled to the detector and the memory circuit for comparing the unidirectional signal level from the noise detector to the storage signal level, and for generating an unmute signal when the unidirectional signal level is less than the stored signal level.

According to another feature of the invention, an attenuation circuit is coupled to the noise detector and the memory circuit for attenuating signals coupled therethrough from the noise detector by a predetermined amount.

According to still another feature of the invention a timing circuit is coupled to the receiver, for disabling reception of transmissions for a predetermined period of time following receiver turn on, thereby permitting the memory circuit to store an initial unidirectional noise signal level.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

FIG. 1 is a generalized block diagram of a receiver incorporating the novel automatic threshold squelch according to the invention.

FIG. 2 is a detailed schematic diagram illustrating one embodiment of the novel automatic threshold squelch according to the invention.

DESCRIPTION OF THE PREFERRED EMBODIMENT

Referring to FIG. 1, there is shown a receiver which includes an antenna 12 for applying signals to a radio frequency (RF) circuit 14. The radio frequency circuit 14 may include frequency selective circuits, and may or may not include amplifying circuitry. Selected signals from the RF circuit 14 are coupled, as shown, to a mixer 16. A local oscillator 18 provides an injection frequency signal so that a resulting signal developed by the mixer 16 is an intermediate frequency (IF) signal. A power on delay circuit 20 (e.g. an RC timing circuit) is coupled, as shown, to the local oscillator 18, to disable the local oscillator 18 for a predetermined time period (e.g. 250 ms) when the receiver is turned on. The intermediate frequency signal from the mixer 16 is amplified in the IF stages indicated at 22. It is to be understood, however, that although a signal mixer and oscillator are shown, which constitutes one conversion, more stages of frequency conversion may be provided in order to provide an intermediate frequency signal at the desired frequency. The intermediate frequency signal amplified and, optionally limited, in the stages 22 is coupled as shown, to a demodulator 24. The demodulator 24 may be of a known circuit configuration which is constructed to reproduce the audio modulation signal, and noise signals greater in frequency than the audio modulation signals. The output of the demodulator 24 is applied, as shown, through a squelch gate 26 to audio amplifiers 28 which amplify the audio modulation signals, and which may also include filtering circuitry. The audio signals, amplified in the audio amplifiers 28, are coupled to a loud speaker 30, or other device for reproducing the modulation signals.

Signals developed at the demodulator 24 are also coupled, as shown, to noise amplifiers 32 which amplify noise signals from the demodulator 24. The noise amplifiers 32, may also include high pass pr bandpass filters (not shown) to pass only high frequency noise. The amplified noise signals are applied to the input 33 of a noise detector 34 of the squelch control circuit indicated generally at 40. The squelch control circuit 40 is composed of the noise detector 34, an attenuator 36, a sample and hold circuit 38, and a comparator 37, configured as shown.

The noise detector 34 responds to noise signals coupled through the noise amplifier 32 from the demodulator 24 to develop a unidirectional output signal which varies in accordance with the level of the noise signals. This output signal is coupled, as shown, to an attenuator 36 and a comparator 37. The attenuator 36 reduces the signal level a predetermined amount and couples the attenuated signal to a sample and hold circuit 38 of conventional design. A signal from the attenuator 36 is sampled and stored by the sample and hold circuit 38, such that the maximum noise signal level is stored during periods of no signal reception by the receiver. This stored noise signal level is applied to the comparator 37, where it is compared to the noise signal level from the noise detector 34. If the noise signal level from the noise detector 34 is greater than the stored signal level, than a high comparator output (i.e. a mute signal) will be generated, and if the noise signal level is less than the stored signal level, a low comparator output (i.e., an unmute signal) will be generated. This output signal is coupled, as shown, to the control input 27 of the squelch gate 26 which inhibits the audio signals when a mute signal is applied and allows audio signals to be coupled to the audio amplifiers 28 and the speaker 30 when an unmute signal is applied.

Referring now to FIG. 2, there is shown a detailed schematic diagram of the preferred embodiment of the squelch control circuitry 40. Noise signals from the noise amplifiers 32 (See FIG. 1) are applied to the input 33 and coupled through a coupling capacitor 42 to the base of the bipolar transistor 50. Also coupled to the base of the transistor 50 is a bias resistor 44. A capacitor 46 is coupled, as shown, from the collector, which is also coupled to a supply voltage V+, to the emitter of the transistor 50, thereby forming a clamping detector. The noise signals coupled to the detector result in a rectified noise signal level across the bias voltage divider resistors 52 and 54. This voltage divider attenuates the noise signal level and together with capacitor 56 provides filtering. The resulting signal is coupled to the non inverting input of the operational amplifier 70 and to a voltage divider made up of the resistors 62 and 64, as shown. This voltage divider forms an attenuator which attenuates the detected noise signal level and applies the attenuated signal to a sample and hold circuit made up of a diode 60, a capacitor 66, and the high impedance inverting input of the operational amplifier 70 as shown. Thus, the attenuated noise signal level, charges the capacitor 66, through the diode 60, and since there is no low impedence discharge path, the capacitor 66 can discharge only very slowly. As a result, the capacitor 66 holds the highest level applied to it and only very slowly discharges when a lower voltage level is applied. This permits the capacitor to automatically store a squelch threshold which can be set to any desired level by the choice of the voltage divider resistor 62 and 64. In addition the circuit can rapidly adjust to increases in background noise, and slowly adjust to long term decreases in background noise as well (e.g., atmospheric changes, warmup). The initial noise level for the no received signal condition is sampled when the radio is first turned on. In order to insure that a no signal noise level is present, the receiver oscillator is inhibited for a short period of time by a power on delay circuit 20 as shown in FIG. 1. The stored signal level is coupled, as shown, to the operational amplifier 70 which functions as a comparator. If the noise signal level applied to the non inverting input of the operational amplifier 70 is greater than the stored level, indicating that no transmitted signal is being received, then the output will be high, and if the same signal is lower than the stored signal, a low output will result. This output signal can then be used to control a squelch gate (see FIG. 1) or other device, such as a busy light.

Although a preferred embodiment is shown using analog circuitry, it is to be understood that digital circuitry is also highly suitable. For example, a digital sample and hold can be used instead of an analog sample and hold, or the entire control circuit functions of the noise detector, attenuator, sample and hold, and comparator can be implemented with a microprocessor.

In summary, an automatic threshold squelch circuit for radio receiver has been described. The automatic threshold squelch circuit allows a one time factory setting of the squelch control while compensating for ambient noise and temperature variations, and permitting maximum threshold squelch sensitivity.

While a preferred embodiment of the invention has been described and shown, it should be understood that other variations and modifications may be implemented. It is therefore contemplated to cover by the present application any and all modifications and variations that fall within the true spirit and scope of the basic underling principles disclosed and claimed herein.

What is claimed is:

1. An automatic threshold squelch circuit, for radio receiver having a demodulator responsive to noise signals from the receiver demodulator for generating a mute signal when no transmission is being received by the receiver, said squelch circuit comprising:
    noise detector means for producing a unidirectional signal level as a function of the noise signal from the demodulator;
    memory means, coupled to the noise detector means, for sampling and storing the unidirectional signal level when no transmissions are being received by the receiver;
    comparator means, coupled to the detector means and the memory means, for comparing the unidirectional signal level from the noise detector means to the stored signal level, and generating an unmute signal when the uni-directional signal level is less than the store signal level.

2. The automatic threshold squelch circuit of claim 1, further comprising attenuation means, coupled to the noise detector means and the memory means, for attenuating signals coupled therethrough from the noise detector means by a predetermined amount.

3. The automatic threshold squelch circuit of claim 1 or 2 further comprising timing means, coupled to the receiver, for disabling reception of transmissions for a predetermined period of time following receiver turn on, thereby permitting the memory means to store an initial unidirectional signal level.

4. The automatic threshold squelch circuit of claim 3, wherein the memory means comprises an analog sample and hold circuit.

5. The automatic threshold squelch circuit of claim 3, wherein the memory means comprises a digital sample and hold circuit.

6. The automatic threshold squelch circuit of claim 1, further comprising filter means, coupled to the demodulator and the noise detector means, for filtering the noise signals and coupling the filtered noise signals to the noise detector means.

7. Communications receiving apparatus which operates in response to incoming signals, comprising:
    radio receiver apparatus including RF, mixer, IF, demodulator, and audio sections;

noise detector means for producing a unidirectional signal level in response to noise signals from the receiver demodulator;

memory means having an input coupled to the noise detector means, for storing the unidirectional signal of the highest level applied to the memory means input;

comparator means, coupled to the detector means and the memory means, for comparing the unidirectional signal level from the noise detector means to the stored signal level and for generating an unmute signal when the uni-directional signal level is less than the stored signal level.

8. The communications receiving apparatus of claim 7, further comprising timing means coupled to the mixer section for disabling the mixer for a predetermined period of time following receiver turn on.

9. The communications receiving apparatus of claim 7 or 8 further comprising attenuation means, coupled to the noise detector means and the memory means, for attenuating signals coupled therethrough from the noise detector means by a predetermined amount.

10. The communications receiving apparatus of claim 7 or 8, further comprising a squelch gate, for coupling the demodulated audio signals from the demodulator section to the audio section, in response to the unmute signal and for inhibiting said demodulated audio signals in the absence of the unmute signal.

11. In communications receiving apparatus having a demodulator, a method of providing automatic squelch, comprising the steps of:

(a) producing a unidirectional signal level as a function of a noise signal level from the receiver demodulator;

(b) storing the unidirectional signal level in response to a predetermined condition producing a stored signal level;

(c) comparing the unidirectional signal level to the stored signal level and generating a squelch control signal when the unidirectional signal level is less than the stored signal level.

12. The method of claim 11 wherein the storing step (b) comprises storing the unidirectional signal level when there is no transmission being received by the receiver.

13. The method of claim 12 further comprising the step of attenuating the unidirectional signal level by a predetermined amount.

* * * * *